(12) United States Patent
Tanaka et al.

(10) Patent No.: US 10,715,084 B2
(45) Date of Patent: Jul. 14, 2020

(54) POWER AMPLIFIER CIRCUIT

(71) Applicant: Murata Manufacturing Co., Ltd., Kyoto (JP)

(72) Inventors: Satoshi Tanaka, Kyoto (JP); Masatoshi Hase, Kyoto (JP); Norio Hayashi, Kyoto (JP); Kazuo Watanabe, Kyoto (JP); Yuuri Honda, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/136,359

(22) Filed: Sep. 20, 2018

(65) Prior Publication Data

US 2019/0089307 A1    Mar. 21, 2019

(30) Foreign Application Priority Data

Sep. 21, 2017 (JP) .................. 2017-181430

(51) Int. Cl.

| | |
|---|---|
| H03F 3/191 | (2006.01) |
| H03F 1/02 | (2006.01) |
| H03F 3/21 | (2006.01) |
| H03F 1/56 | (2006.01) |
| H03F 3/19 | (2006.01) |
| H03F 3/24 | (2006.01) |
| H03F 3/195 | (2006.01) |

(52) U.S. Cl.
CPC ........... H03F 1/0205 (2013.01); H03F 1/565 (2013.01); H03F 3/19 (2013.01); H03F 3/195 (2013.01); H03F 3/21 (2013.01); H03F 3/245 (2013.01); *H03F 2200/387* (2013.01); *H03F 2200/451* (2013.01)

(58) Field of Classification Search
CPC ....................................................... H03F 3/191
USPC ................................................. 330/302, 305
See application file for complete search history.

(56) References Cited

U.S. PATENT DOCUMENTS

| | | | | |
|---|---|---|---|---|
| 5,339,048 A | * | 8/1994 | Weber | ............... H03F 1/3205 330/302 |
| 5,708,573 A | * | 1/1998 | Lusher | ............... H02M 3/155 323/222 |
| 7,693,495 B2 | * | 4/2010 | Itkin | ................... H03H 11/30 455/107 |

(Continued)

FOREIGN PATENT DOCUMENTS

JP    2006-319508 A    11/2006

OTHER PUBLICATIONS

Tanaka, S., "Evolution of Power Amplifier for mobile applications", the Institute of Electrical and Electronics Engineers, Inc. (IEEE) 2013 International Meeting for Future of Electron Devices, Jun. 2013, pp. 112-113 Kansai (IMFEDK 2013).

*Primary Examiner* — Henry Choe

(74) *Attorney, Agent, or Firm* — Pearne & Gordon LLP

(57) ABSTRACT

A power amplifier circuit includes an amplifier that receives an input signal with an alternating current and outputs an output signal obtained by amplifying power of the input signal to a first node; an inductive element that is connected between the first node and a second node; and a variable capacitor that is connected between the second node and a reference potential, and whose electrostatic capacitance increases as power of the output signal increases.

20 Claims, 13 Drawing Sheets

(56) References Cited

U.S. PATENT DOCUMENTS

2006/0267688 A1  11/2006  Tanoue et al.
2010/0301956 A1* 12/2010  Nakamura ............ H03B 5/1228
                                           331/117 FE

* cited by examiner

POWER AMPLIFIER CIRCUIT

This application claims priority from Japanese Patent Application No. 2017-181430 filed on Sep. 21, 2107. The content of this application is incorporated herein by reference in its entirety.

BACKGROUND

The present disclosure relates to a power amplifier circuit. In cellular phone devices, smartphones, and the like, a power amplifier is used for amplifying radio frequency (RF) signals (see Satoshi Tanaka, "Evolution of Power Amplifier for mobile applications", the Institute of Electrical and Electronics Engineers, Inc. (IEEE) 2013 International Meeting for Future of Electron Devices, Kansai (IMFEDK 2013), June 2013, pp. 112-113).

In general, in a power amplifier circuit, when output power is at its maximum value, efficiency reaches its maximum value. Thus, when the output power is below its maximum value, the efficiency is below its maximum value. For example, an average value of the output power is below the maximum value of the output power. Hence, the power amplifier circuit may not achieve desirable efficiency over a wide output power range.

BRIEF SUMMARY

In view of the above, the present disclosure has been made to enable desirable efficiency to be achieved over a wide output power range.

A power amplifier circuit according to an embodiment of the present disclosure includes an amplifier that receives an input signal with an alternating current and outputs an output signal obtained by amplifying power of the input signal to a first node; an inductive element that is connected between the first node and a second node; and a variable capacitor that is connected between the second node and a reference potential, and whose electrostatic capacitance increases as power of the output signal increases.

Embodiments of the present disclosure enable desirable efficiency to be achieved over a wide output power range.

Other features, elements, characteristics and advantages of the present disclosure will become more apparent from the following detailed description of embodiments of the present disclosure with reference to the attached drawings.

DETAILED DESCRIPTION

Embodiments of a power amplifier circuit according to the present disclosure will be described in detail below with reference to the drawings. The present disclosure is not to be limited by these embodiments.

First Embodiment

Figure 1:
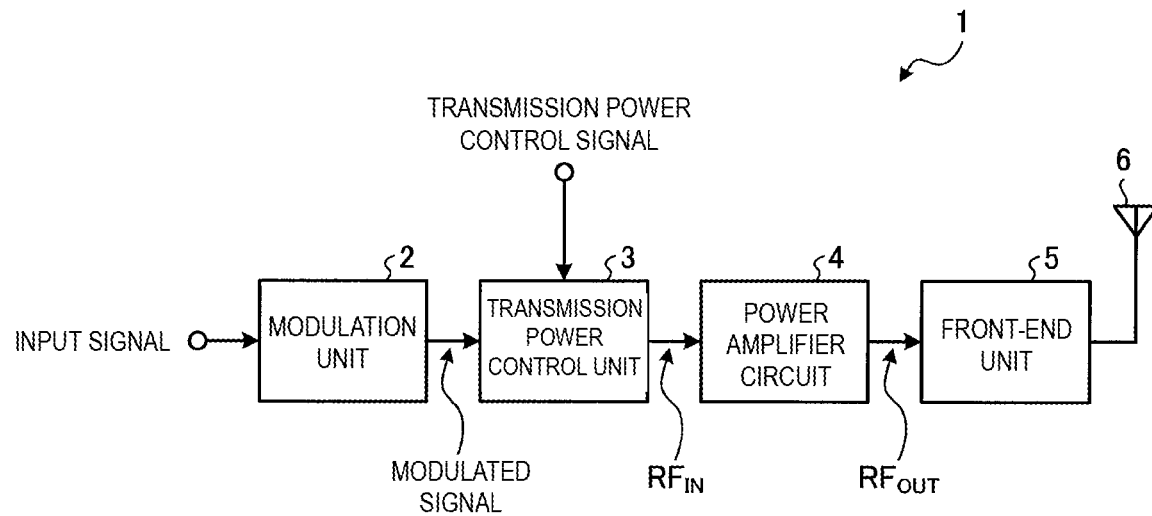
FIG. 1 illustrates a configuration of a transmission unit including a power amplifier circuit according to a first embodiment.

FIG. 1 illustrates a configuration of a transmission unit including a power amplifier circuit according to a first embodiment. A transmission unit 1 is used in, for example, a mobile communication device, such as a cellular phone, to transmit various signals, such as voice and data, to a base station. Although the mobile communication device also includes a reception unit for receiving signals from the base station, description of the reception unit is omitted herein.

As illustrated in FIG. 1, the transmission unit 1 includes a modulation unit 2, a transmission power control unit 3, a power amplifier circuit 4, a front-end unit 5, and an antenna 6.

The modulation unit 2 outputs, to the transmission power control unit 3, a radio frequency (RF) modulated signal obtained by modulating an input signal on the basis of a modulation system, such as a high speed uplink packet access (HSUPA) system or a long term evolution (LTE) system. As an example, the frequency of the modulated signal ranges from about several hundred MHz to about several GHz. However, the frequency is not limited to these.

The transmission power control unit 3 outputs, to the power amplifier circuit 4, a radio frequency input signal $RF_{IN}$ obtained by adjusting the power of the modulated signal on the basis of a transmission power control signal. A transmission power control signal is generated on the basis of, for example, an adaptive power control (APC) signal transmitted from the base station. For example, the base station measures a signal from the mobile communication device and thus can transmit, as a command for adjusting transmission power in the mobile communication device to an appropriate level, an APC signal to the mobile communication device.

The power amplifier circuit 4 outputs, to the front-end unit 5, a radio frequency output signal $RF_{OUT}$ obtained by amplifying the power of the radio frequency input signal $RF_{IN}$ to a level necessary to transmit the signal to the base station. In embodiments, the transmission unit 1 includes, but is not limited to, one power amplifier circuit 4. The transmission unit 1 may include a plurality of power amplifier circuits 4 connected to form multiple stages.

The front-end unit 5 performs filtering on the radio frequency output signal $RF_{OUT}$, switching between the radio frequency output signal $RF_{OUT}$ and a reception signal received from the base station, and so forth. A radio frequency signal output from the front-end unit 5 is transmitted to the base station via the antenna 6.

Figure 2:
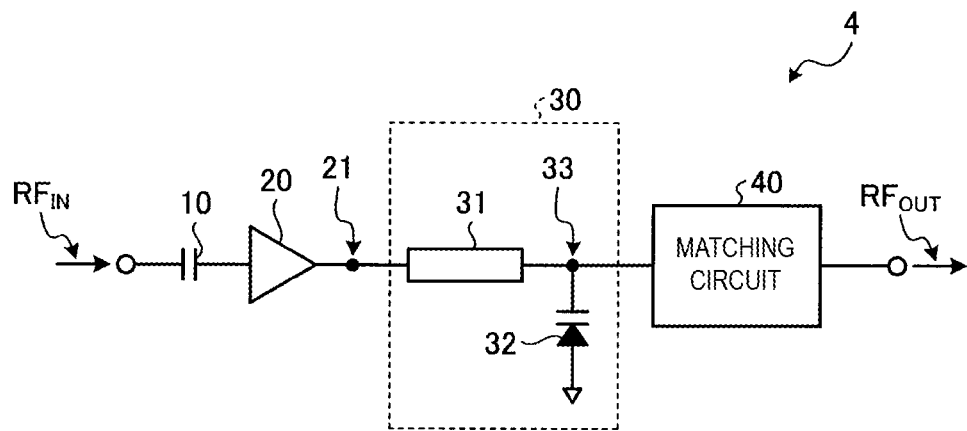
FIG. 2 illustrates a configuration of the power amplifier circuit according to the first embodiment.

FIG. 2 illustrates a configuration of the power amplifier circuit according to the first embodiment. The power amplifier circuit 4 includes a capacitor 10, an amplifier 20, and matching circuits 30 and 40. The matching circuit 30 includes an inductive element 31 and a variable capacitor 32.

A radio frequency input signal $RF_{IN}$ is supplied to one end of the capacitor 10 from the preceding transmission power control unit 3 (see FIG. 1). The capacitor 10 blocks a direct-current component of the radio frequency input signal $RF_{IN}$ and outputs only an alternating-current component of the radio frequency input signal $RF_{IN}$ from the other end to the amplifier 20. That is, the capacitor 10 serves as a coupling capacitor. The capacitor 10 also serves as an impedance matching element that matches an output impedance of the preceding transmission power control unit 3 to an input impedance of the amplifier 20.

The amplifier 20 amplifies the power of the radio frequency input signal $RF_{IN}$ having passed through the capacitor 10 to a level necessary to transmit the signal to the base station, and outputs an amplified radio frequency output signal $RF_{OUT}$ to one end of the inductive element 31. In the embodiments, power output by the amplifier 20 is referred to as output power $P_{OUT}$. Although an example of the inductive element 31 is a transmission line or a coil, the inductive element 31 is not limited to these.

One end of the variable capacitor 32 is connected to the other end of the inductive element 31. The other end of the variable capacitor 32 is connected to a reference potential. In the embodiments, although the reference potential is a ground potential, the reference potential is not limited to this. The variable capacitor 32 will be described in detail later.

The inductive element 31 and the variable capacitor 32 constitute the matching circuit 30. For example, when an impedance of a second node 33, which is a connection point between the matching circuit 30 and the matching circuit 40, looking into a matching circuit 40 side is about 14 ohms, the matching circuit 30 can cause an impedance of a first node 21, which is a connection point between the amplifier 20 and the matching circuit 30, as seen from an amplifier 20 side to be equal to about 4 ohms. In the embodiments, an impedance of the first node 21 as seen from the amplifier 20 side is referred to as a load impedance $Z_{OUT}$. Furthermore, when an output of the matching circuit 40 is terminated at about 50 ohms, the matching circuit 40 can cause an impedance of the second node 33 to be equal to about 14 ohms.

The radio frequency output signal $RF_{OUT}$ is output from the matching circuit 40 to the subsequent front-end unit 5.

Next, the variable capacitor 32 will be described. The variable capacitor 32 is a circuit component whose electrostatic capacitance increases as voltage applied to the second node 33 decreases, and whose electrostatic capacitance decreases as voltage applied to the second node 33 increases. Although an example of the variable capacitor 32 is a positive-negative (PN) junction capacitor, a metal oxide semiconductor (MOS) capacitor, or a variable capacitance diode (varicap, varactor), the variable capacitor 32 is not limited to these.

Figure 3:
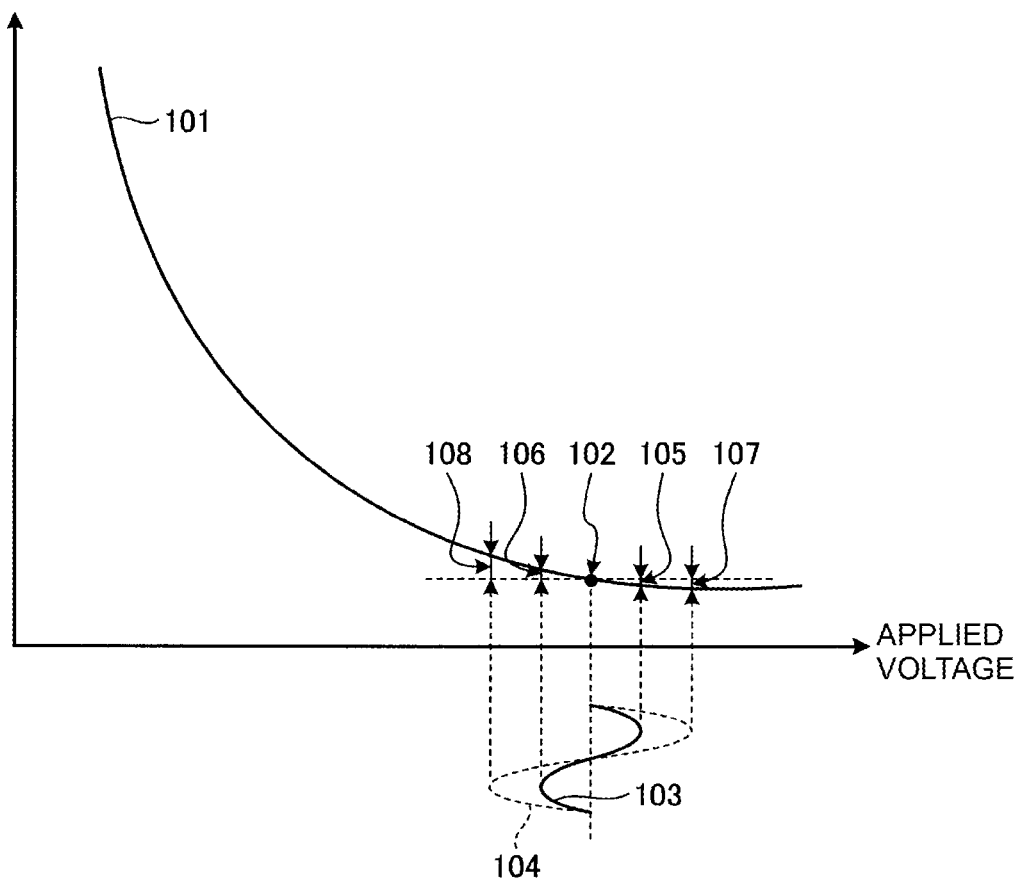
FIG. 3 illustrates characteristics of the power amplifier circuit according to the first embodiment.

FIG. 3 illustrates characteristics of the power amplifier circuit according to the first embodiment. More specifically, FIG. 3 illustrates a relationship between voltage applied to and electrostatic capacitance of the variable capacitor 32 of the power amplifier circuit 4 according to the first embodiment. A line 101 represents a relationship between voltage applied to and electrostatic capacitance of the variable capacitor 32. A PN junction capacitor, an MOS capacitor, and a variable capacitance diode can be used. For example, in the case of the PN junction capacitor, a depletion layer narrows as applied voltage decreases, and thus electrostatic capacitance increases. Furthermore, the depletion layer widens as the applied voltage increases, and thus the electrostatic capacitance decreases. The width of the depletion layer is proportional to the square root of the applied voltage. The electrostatic capacitance is inversely proportional to the width of the depletion layer. Thus, the electrostatic capacitance of each of the PN junction capacitor, the MOS capacitor, and the variable capacitance diode is inversely proportional to the square root of the applied voltage.

A waveform 103 represents voltage applied to the variable capacitor 32 in the case where output power $P_{OUT}$ is low. Although an example of the case where the output power $P_{OUT}$ is low refers to transmission idle time, the case where the output power $P_{OUT}$ is low is not limited to this.

A waveform 104 represents voltage applied to the variable capacitor 32 in the case where the output power $P_{OUT}$ is high. Although an example of the case where the output power is $P_{OUT}$ high refers to maximum power transmission time, the case where the output power $P_{OUT}$ is high is not limited to this.

At the time of a positive polarity peak of the waveform 103, the electrostatic capacitance of the variable capacitor 32 is smaller than the electrostatic capacitance at an operating point 102 by a difference 105. At the time of a negative (opposite) polarity peak of the waveform 103, the electrostatic capacitance of the variable capacitor 32 is larger than the electrostatic capacitance at the operating point 102 by a difference 106. The difference 105 and the difference 106 are substantially the same. Thus, average electrostatic capacitance of the variable capacitor 32 in one period of the waveform 103 is substantially the same as the electrostatic capacitance at the operating point 102.

At the time of a positive polarity peak of the waveform 104, the electrostatic capacitance of the variable capacitor 32 is smaller than the electrostatic capacitance at the operating point 102 by a difference 107. At the time of a negative polarity peak of the waveform 104, the electrostatic capacitance of the variable capacitor 32 is larger than the electrostatic capacitance at the operating point 102 by a difference 108. Here, the difference 108 is larger than the difference 107. Thus, average electrostatic capacitance of the variable capacitor 32 in one period of the waveform 104 is larger than the electrostatic capacitance at the operating point 102.

Thus, the electrostatic capacitance of the variable capacitor 32 decreases as the output power $P_{OUT}$ decreases. The electrostatic capacitance of the variable capacitor 32 increases as the output power $P_{OUT}$ increases.

Furthermore, the load impedance $Z_{OUT}$ is represented by the following Equation (1).

$$Z_{OUT} = \frac{R_M}{\omega^2 C^2 R_M^2 + 1} + j\left(\omega L - \frac{\omega C R_M^2}{\omega^2 C^2 R_M^2 + 1}\right) \quad (1)$$

In Equation (1), $R_M$ is a value of impedance of the matching circuit 30 looking into the matching circuit 40 when the output of the matching circuit 40 is terminated at about 50 ohms. As $R_M$, complex impedance may be essentially taken, but real resistance is taken for simplicity. In Equation (1), $\omega$ is an angular frequency of the radio frequency output signal $RF_{OUT}$, L is inductance of the inductive element 31, and C is electrostatic capacitance of the variable capacitor 32.

$$\omega_0 = \frac{\sqrt{CR_M^2 - L}}{CR_M} \quad (2)$$

When $\omega$ is $\omega_0$ that satisfies the above Equation (2), the imaginary part of Equation 1 is 0, and $Z_{OUT}$ is real resistance. Typically, $\omega_0$ is taken as a design center value. According to Equation (1), the real part of the load impedance $Z_{OUT}$ decreases as the electrostatic capacitance C of the variable capacitor 32 increases. Conversely, the real part of the load impedance $Z_{OUT}$ increases as the electrostatic capacitance C of the variable capacitor 32 decreases.

Thus, the load impedance $Z_{OUT}$ increases as the output power $P_{OUT}$ decreases. The load impedance $Z_{OUT}$ decreases as the output power $P_{OUT}$ increases.

Figure 4:
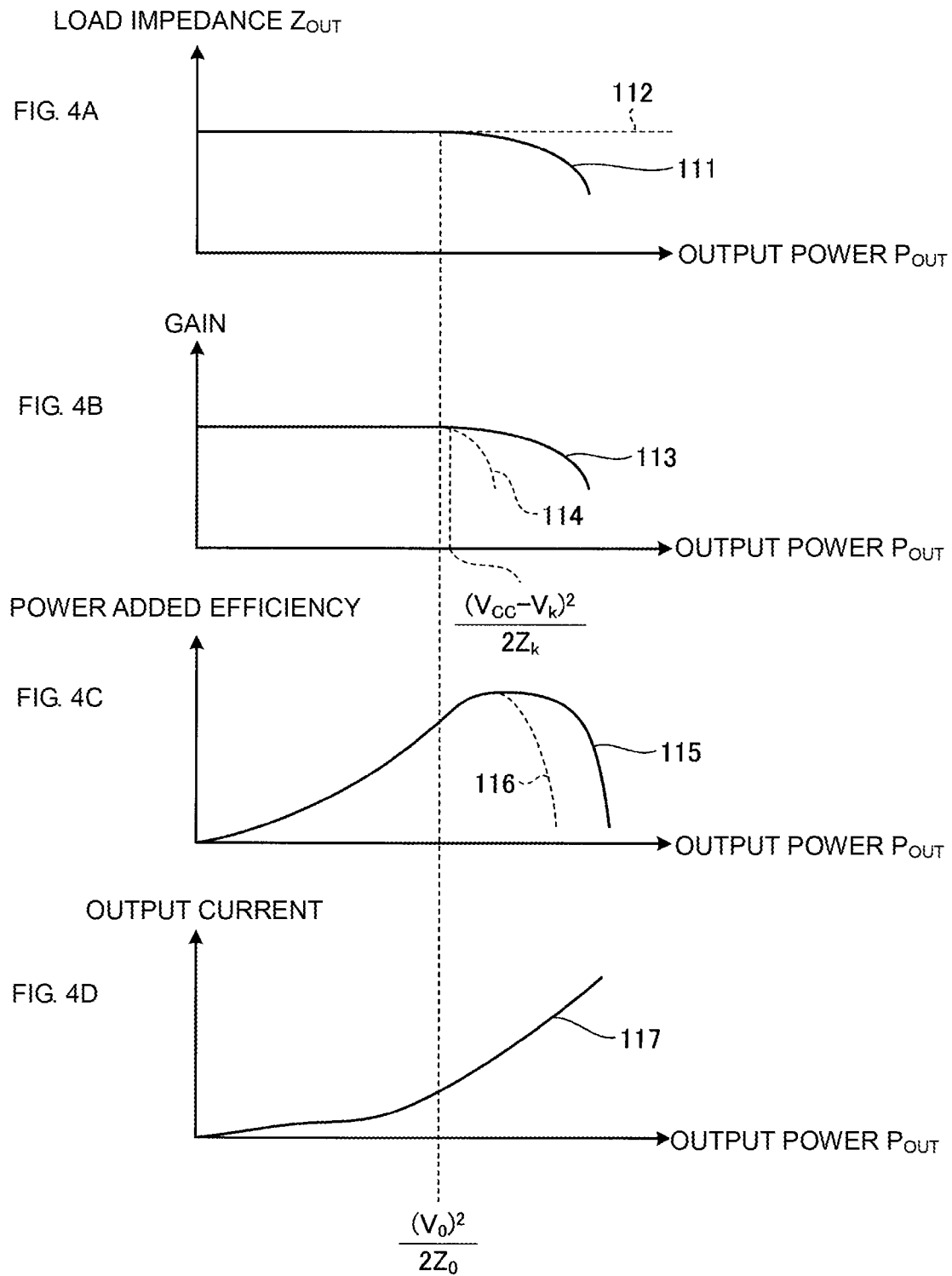
FIGS. 4A to 4D illustrate characteristics of the power amplifier circuit according to the first embodiment.

FIGS. 4A to 4D illustrate characteristics of the power amplifier circuit according to the first embodiment. FIG. 4A illustrates a relationship between the output power $P_{OUT}$ and the load impedance $Z_{OUT}$ of the power amplifier circuit 4 according to the first embodiment. FIG. 4B illustrates a relationship between the output power $P_{OUT}$ and the gain of the power amplifier circuit 4 according to the first embodiment. FIG. 4C illustrates a relationship between the output power $P_{OUT}$ and the power added efficiency (PAE) of the power amplifier circuit 4 according to the first embodiment. FIG. 4D illustrates a relationship between the output power $P_{OUT}$ and the output current of the power amplifier circuit 4 according to the first embodiment.

Figure 5:
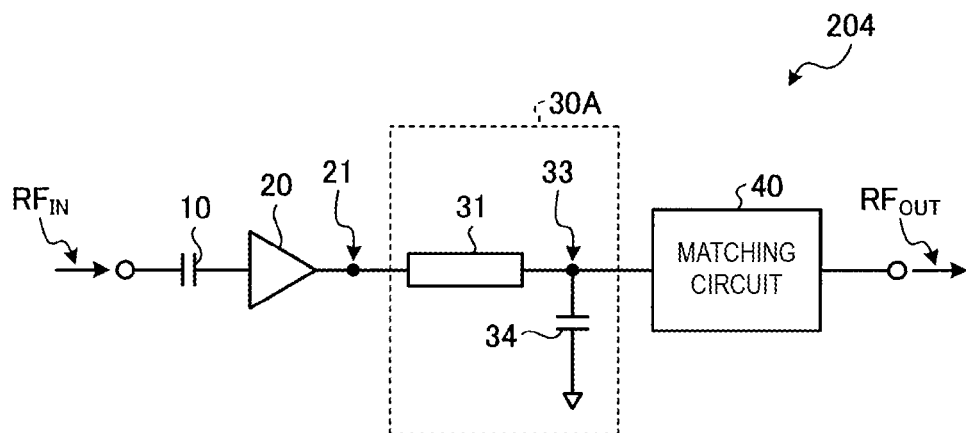
FIG. 5 illustrates a configuration of a power amplifier circuit in a first comparative example.

FIG. 5 illustrates a configuration of a power amplifier circuit in a first comparative example. In a power amplifier circuit 204 in the first comparative example, the matching circuit 30 of the power amplifier circuit 4 according to the first embodiment is replaced with a matching circuit 30A. In the matching circuit 30A, the variable capacitor 32 of the matching circuit 30 of the power amplifier circuit 4 according to the first embodiment is replaced with a capacitor 34 having a fixed capacitance.

Referring to FIG. 4A, a line 111 represents a relationship between the output power $P_{OUT}$ and the load impedance $Z_{OUT}$ of the power amplifier circuit 4 according to the first embodiment. A line 112 represents a relationship between the output power $P_{OUT}$ and the load impedance $Z_{OUT}$ of the power amplifier circuit 204 in the first comparative example.

As indicated by the line 112, the load impedance $Z_{OUT}$ of the power amplifier circuit 204 in the first comparative example is constant regardless of the output power $P_{OUT}$. On the other hand, as indicated by the line 111, the load impedance $Z_{OUT}$ of the power amplifier circuit 4 according to the first embodiment starts to decrease in the neighborhood of $P_{OUT}=(V_0)^2/Z_0$. Here, $V_0$ is voltage amplitude ($V_{OP}$) at which a value of the variable capacitor 32 appears in accordance with a change in signal amplitude. Then, $Z_0$ is a load impedance $Z_{OUT}$ at which the output power $P_{OUT}$ is in the neighborhood of 0. In other words, $Z_0$ is a load impedance $Z_{OUT}$ determined according to Equation (1) using a value of the variable capacitor 32 obtained in the case where output voltage amplitude is small.

Referring to FIG. 4B, a line 113 represents a relationship between the output power $P_{OUT}$ and the gain of the power amplifier circuit 4 according to the first embodiment. A line 114 represents a relationship between the output power $P_{OUT}$ and the gain of the power amplifier circuit 204 in the first comparative example.

As indicated by the line 114, the gain of the power amplifier circuit 204 in the first comparative example starts to decrease sharply in the neighborhood of $P_{OUT}=(V_{CC}-V_k)^2/Z_k$. Here, $V_k$ is a minimum voltage at which the amplifier 20 operates linearly. In the case where the amplifier 20 is constituted by a transistor, $V_k$ is a minimum collector-emitter voltage at which the transistor operates linearly. In other words, $V_k$ is a collector-emitter voltage at a boundary between a saturation region and an active region of the transistor. Furthermore, $Z_k$ refers to a value of output impedance at the above-described output level. On the other hand, as indicated by the line 113, the gain of the power amplifier circuit 4 according to the first embodiment starts to decrease moderately in the neighborhood of $P_{OUT}=(V_0)^2/Z_0$. The reason why the gain of the power amplifier circuit 4 according to the first embodiment decreases more moderately than the gain of the power amplifier circuit 204 in the first comparative example is because the load impedance $Z_{OUT}$ of the power amplifier circuit 4 according to the first embodiment starts to decrease in the neighborhood of $P_{OUT}=(V_0)^2/Z_0$. Then, $(V_0)^2/Z_0$ has a value lower than $(V_{CC}-V_k)^2/Z_k$, and thus the load impedance decreases before a sharp decrease, slowing down a reduction in output power.

Referring to FIG. 4C, a line 115 represents a relationship between the output power $P_{OUT}$ and the power added efficiency of the power amplifier circuit 4 according to the first embodiment. A line 116 represents a relationship between the output power $P_{OUT}$ and the power added efficiency of the power amplifier circuit 204 in the first comparative example. In general, assuming that input RF power to a power amplifier circuit is $P_{in}$, that output RF power of the power amplifier circuit is $P_{out}$, and that direct-current power consumed by the power amplifier circuit is $P_{dc}$, power added efficiency is determined by $P_{out}/(P_{dc}+P_{in})$ or $(P_{out}-P_{in})/P_{dc}$.

As indicated by the lines 116 and 114, the power added efficiency of the power amplifier circuit 204 in the first comparative example starts to decrease sharply with a sharp decrease in gain. On the other hand, as indicated by the lines 115 and 113, the gain decreases moderately, and thus the power added efficiency of the power amplifier circuit 4 according to the first embodiment is substantially maintained over a range in which the output power $P_{OUT}$ is high. That is, an output power $P_{OUT}$ range in which desirable power added efficiency of the power amplifier circuit 4 according to the first embodiment is achieved is wider than an output power $P_{OUT}$ range in which desirable power added efficiency of the power amplifier circuit 204 in the first comparative example is achieved. Furthermore, the maximum output power of the power amplifier circuit 4 according to the first embodiment is higher than the maximum output power of the power amplifier circuit 204 in the first comparative example.

Referring to FIG. 4D, a line 117 represents a relationship between the output power $P_{OUT}$ and the output current of the power amplifier circuit 4 according to the first embodiment. As indicated by the line 117, the rate of increase of the output current of the power amplifier circuit 4 according to the first embodiment increases in the neighborhood of $P_{OUT}=(V_0)^2/Z_0$.

In the matching circuit 30 of the power amplifier circuit 4 according to the first embodiment, the load impedance $Z_{OUT}$ starts to decrease in the neighborhood of $P_{OUT}=(V_0)^2/Z_0$. Because of this, the gain of the power amplifier circuit 4 according to the first embodiment starts to decrease moderately in the neighborhood of $P_{OUT}=(V_0)^2/Z_0$. Hence, the power amplifier circuit 4 according to the first embodiment can achieve desirable efficiency over a wide output power $P_{OUT}$ range in comparison with the power amplifier circuit 204 in the first comparative example. Thus, the transmission unit 1 can improve efficiency during modulated signal transmission.

Second Embodiment

Figure 6:
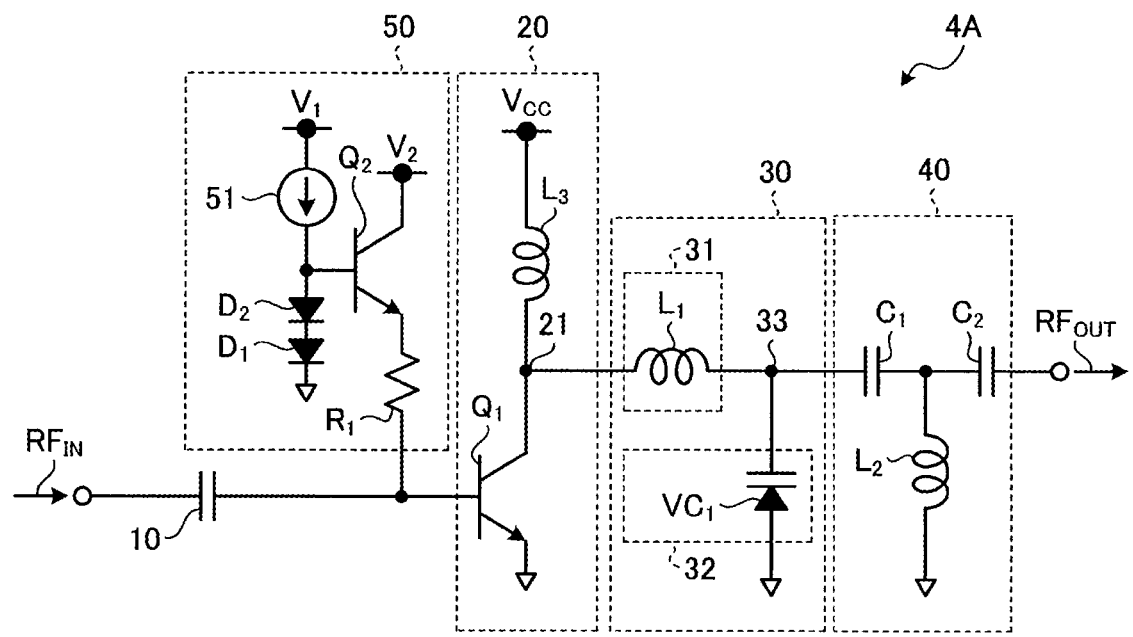
FIG. 6 illustrates a configuration of a power amplifier circuit according to a second embodiment.

FIG. 6 illustrates a configuration of a power amplifier circuit according to a second embodiment. Components that are the same as those in the first embodiment are denoted by the same reference numerals, and description thereof is omitted.

A power amplifier circuit 4A includes the capacitor 10, the amplifier 20, the matching circuits 30 and 40, and a bias circuit 50.

As an example, the amplifier 20 includes a transistor $Q_1$ and a direct-current choke inductor $L_3$. Although an example of the transistor $Q_1$ is an NPN-type heterojunction bipolar transistor (HBT), the transistor $Q_1$ is not limited to this. An emitter of the transistor $Q_1$ is connected to the reference potential. The radio frequency input signal $RF_{IN}$ having passed through the capacitor 10 is supplied to a base of the transistor $Q_1$. A collector of the transistor $Q_1$ is connected to the first node 21. In the case where the transistor $Q_1$ is the NPN-type HBT, a minimum voltage $V_k$ at which the amplifier 20 operates linearly is a collector-emitter voltage at a boundary between a saturation region and an active region of the transistor $Q_1$, and ranges from about 0.2 V to about 0.3 V.

The direct-current choke inductor $L_3$ is connected between a power supply potential $V_{CC}$ and the first node 21. The direct-current choke inductor L3 supplies direct-current power at the power supply potential $V_{CC}$ to the collector of the transistor $Q_1$. The direct-current choke inductor $L_3$ has an impedance high enough for a frequency band of the radio frequency output signal $RF_{OUT}$. That is, the impedance of the direct-current choke inductor $L_3$ is negligible in considering the frequency band of the radio frequency output signal $RF_{OUT}$. Thus, the load impedance $Z_{OUT}$ is not affected by the direct-current choke inductor $L_3$ in considering the frequency band of the radio frequency output signal $RF_{OUT}$.

The inductive element 31 of the matching circuit 30 includes an inductor $L_1$. The variable capacitor 32 of the matching circuit 30 includes a variable capacitance element $VC_1$. The inductor $L_1$ is connected between the first node 21 and the second node 33. The variable capacitance element $VC_1$ is connected between the second node 33 and the reference potential.

The matching circuit 40 includes capacitors $C_1$ and $C_2$, and an inductor $L_2$. One end of the capacitor $C_1$ is connected to the second node 33. The inductor $L_2$ is connected between the other end of the capacitor $C_1$ and the reference potential. One end of the capacitor $C_2$ is connected to a connection point between the capacitor $C_1$ and the inductor $L_2$. The capacitor $C_2$ serves not only as an impedance matching element but also as a coupling capacitor. The radio frequency output signal $RF_{OUT}$ is output from the other end of the capacitor $C_2$ to the subsequent front-end unit 5 (see FIG. 1).

The bias circuit 50 includes a constant current source 51, diodes $D_1$ and $D_2$, a transistor $Q_2$, and a resistor $R_1$ that is a resistive element. Although an example of the transistor $Q_2$ is an NPN-type HBT, the transistor $Q_2$ is not limited to this. It is desirable that the transistor $Q_2$ is of the same type and has the same size and characteristics as the transistor $Q_1$.

A cathode of the diode $D_1$ is connected to the reference potential. A cathode of the diode $D_2$ is connected to an anode of the diode $D_1$. The constant current source 51 is connected between a power supply potential $V_1$ and an anode of the diode $D_2$. A connection point between the anode of the diode $D_2$ and the constant current source 51 is connected to a base of the transistor $Q_2$. Thus, a voltage corresponding to a voltage drop across the diodes $D_1$ and $D_2$ is a base voltage of the transistor $Q_2$. The diodes $D_1$ and $D_2$ may constitute a diode-connected configuration in which a collector and a base of a transistor are connected.

A collector of the transistor $Q_2$ is connected to a power supply potential $V_2$. The resistor $R_1$ is connected between an emitter of the transistor $Q_2$ and the base of the transistor $Q_1$. That is, the transistor $Q_2$ and the resistor $R_1$ constitute an emitter follower circuit.

The power supply potentials $V_{CC}$, $V_1$, and $V_2$ may be the same or different from one another.

Figure 7:
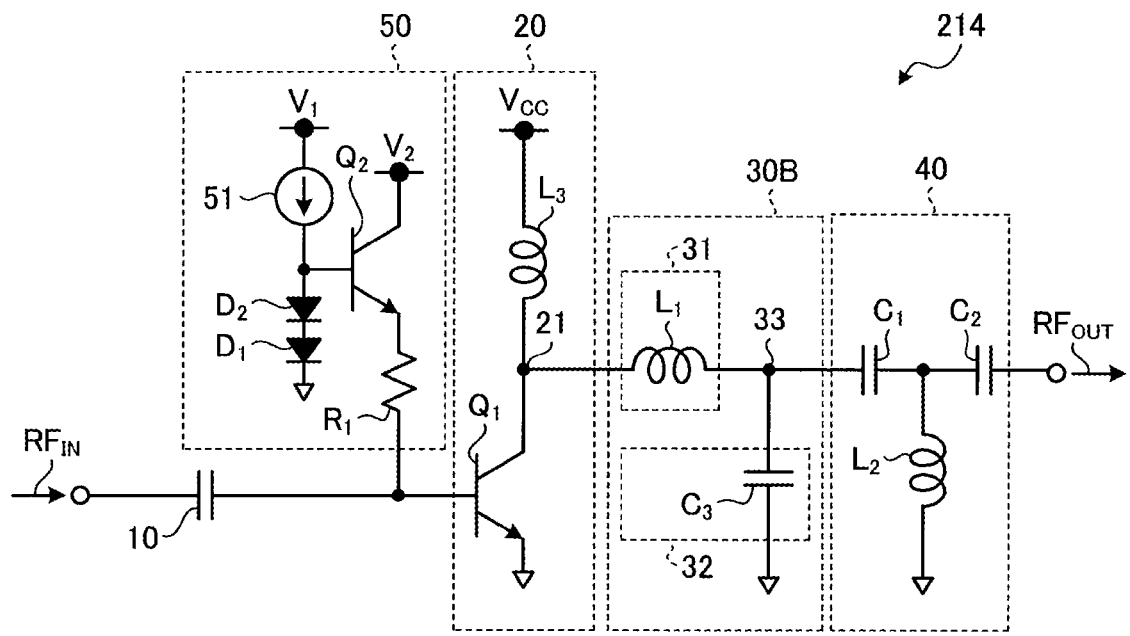
FIG. 7 illustrates a configuration of a power amplifier circuit in a second comparative example.

FIG. 7 illustrates a configuration of a power amplifier circuit in a second comparative example. In a power amplifier circuit 214 in the second comparative example, the matching circuit 30 of the power amplifier circuit 4A according to the second embodiment is replaced with a matching circuit 30B. In the matching circuit 30B, the variable capacitance element $VC_1$ of the matching circuit 30 of the power amplifier circuit 4A according to the second embodiment is replaced with a capacitor $C_3$ having a fixed capacitance.

Figure 8:
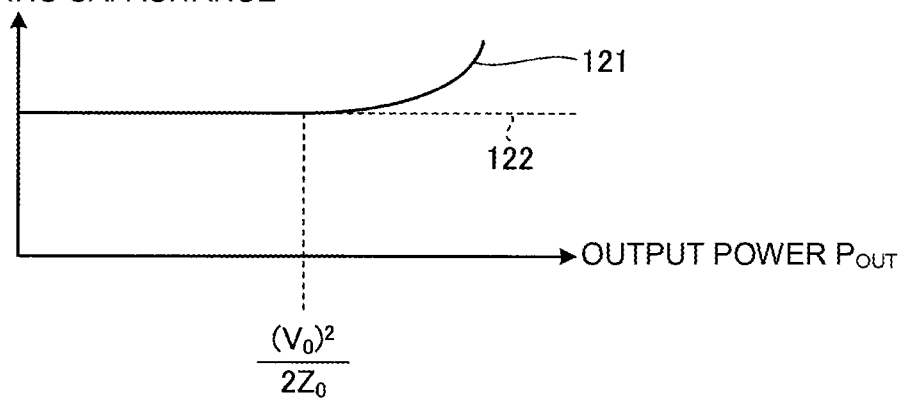
FIG. 8 illustrates characteristics of the power amplifier circuit according to the second embodiment.

FIG. 8 illustrates characteristics of the power amplifier circuit according to the second embodiment. A line 121 represents a relationship between the output power $P_{OUT}$ of the power amplifier circuit 4A and the electrostatic capacitance of the variable capacitance element $VC_1$ in the second embodiment. A line 122 represents a relationship between the output power $P_{OUT}$ of the power amplifier circuit 214 and the electrostatic capacitance of the capacitor $C_3$ in the second comparative example.

As indicated by the line 122, the electrostatic capacitance of the capacitor $C_3$ of the power amplifier circuit 214 in the second comparative example is constant regardless of the output power $P_{OUT}$. On the other hand, as indicated by the line 121, the electrostatic capacitance of the variable capacitance element $VC_1$ of the power amplifier circuit 4A according to the second embodiment starts to increase in the neighborhood of $P_{OUT}=(V_0)^2/Z_0$.

Figure 9:
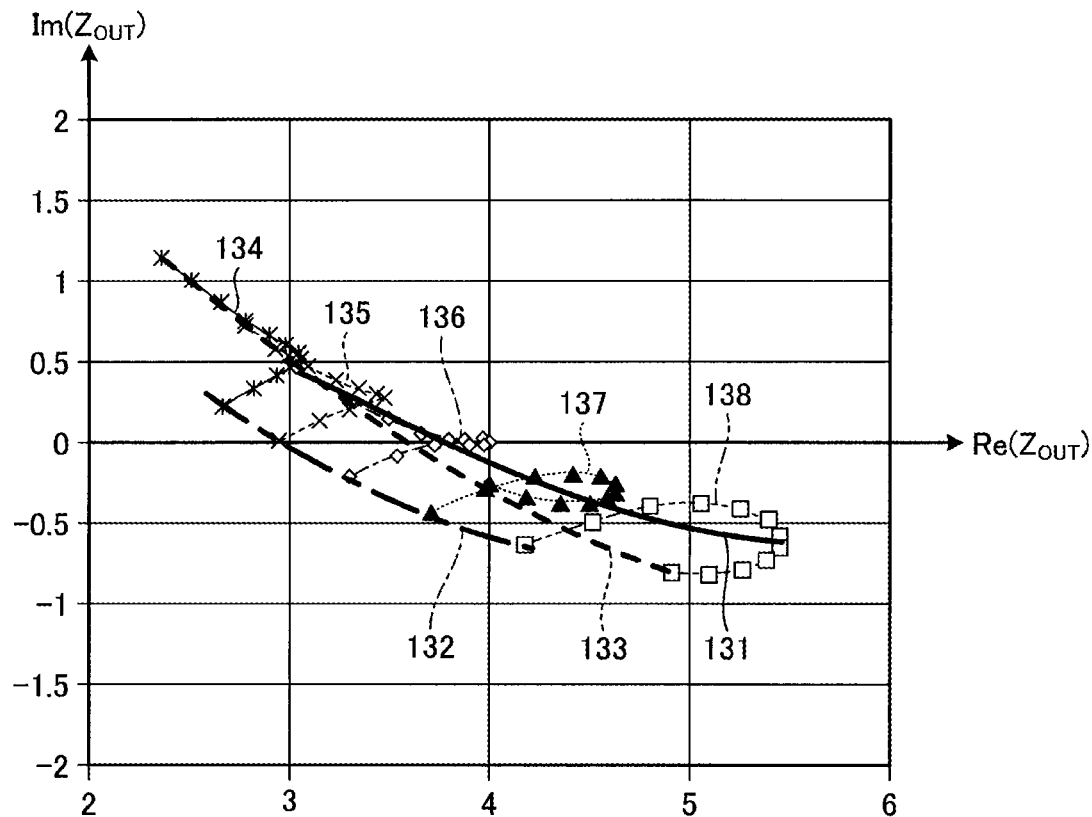
FIG. 9 illustrates characteristics of the power amplifier circuit according to the second embodiment.

FIG. 9 illustrates characteristics of the power amplifier circuit according to the second embodiment. More specifically, FIG. 9 illustrates a relationship between the load impedance $Z_{OUT}$, and the frequency of the radio frequency output signal $RF_{OUT}$ and the electrostatic capacitance of the variable capacitance element $VC_1$. In FIG. 9, the horizontal axis represents the real part of the load impedance $Z_{OUT}$, and the vertical axis represents the imaginary part of the load impedance $Z_{OUT}$.

A line 131 represents the load impedance $Z_{OUT}$ obtained when it is assumed that the frequency of the radio frequency output signal $RF_{OUT}$ is about 800 MHz and that the electrostatic capacitance of the variable capacitance element $VC_1$ changes in the range of about ±20% from an initial value (during communication idle time).

A line 132 represents the load impedance $Z_{OUT}$ obtained when it is assumed that the frequency of the radio frequency output signal $RF_{OUT}$ is about 700 MHz and that the electrostatic capacitance of the variable capacitance element $VC_1$ changes in the range of about ±20% from the initial value.

A line 133 represents the load impedance $Z_{OUT}$ obtained when it is assumed that the frequency of the radio frequency output signal $RF_{OUT}$ is about 900 MHz and that the electrostatic capacitance of the variable capacitance element $VC_1$ changes in the range of about ±20% from the initial value.

A line 134 represents the load impedance $Z_{OUT}$ obtained when it is assumed that the electrostatic capacitance of the variable capacitance element $VC_1$ increases by about 20% from the initial value and that the frequency of the radio frequency output signal $RF_{OUT}$ changes from about 700 MHz to about 900 MHz.

A line 135 represents the load impedance $Z_{OUT}$ obtained when it is assumed that the electrostatic capacitance of the variable capacitance element $VC_1$ increases by about 10% from the initial value and that the frequency of the radio frequency output signal $RF_{OUT}$ changes from about 700 MHz to about 900 MHz.

A line 136 represents the load impedance $Z_{OUT}$ obtained when it is assumed that the electrostatic capacitance of the variable capacitance element $VC_1$ is the initial value and that the frequency of the radio frequency output signal $RF_{OUT}$ changes from about 700 MHz to about 900 MHz.

A line 137 represents the load impedance $Z_{OUT}$ obtained when it is assumed that the electrostatic capacitance of the variable capacitance element $VC_1$ decreases by about 10% from the initial value and that the frequency of the radio frequency output signal $RF_{OUT}$ changes from about 700 MHz to about 900 MHz.

A line 138 represents the load impedance $Z_{OUT}$ obtained when it is assumed that the electrostatic capacitance of the variable capacitance element $VC_1$ decreases by about 20% from the initial value and that the frequency of the radio frequency output signal $RF_{OUT}$ changes from about 700 MHz to about 900 MHz.

As indicated by the lines 134 to 138, the load impedance $Z_{OUT}$ decreases as the electrostatic capacitance of the variable capacitance element $VC_1$ increases.

The power amplifier circuit 4A according to the second embodiment makes it possible to desirably change the load impedance $Z_{OUT}$ with a practical number of elements.

Next, the bias circuit 50 will be described. The transistor $Q_2$ and the resistor $R_1$ that are included in the bias circuit 50 constitute an emitter follower circuit. Thus, the transistor $Q_2$ operates so that a base-emitter voltage is constant (a diode turn-on voltage). Here, a base voltage of the transistor $Q_2$ is constant. Thus, the transistor $Q_2$ operates so that an emitter voltage is constant. That is, the transistor $Q_2$ can be regarded as a constant voltage source. Actually, although a base potential of the transistor $Q_2$ moves slightly according to the radio frequency input signal $RF_{IN}$ in some cases, such approximation operation is primarily achieved.

Figure 10:
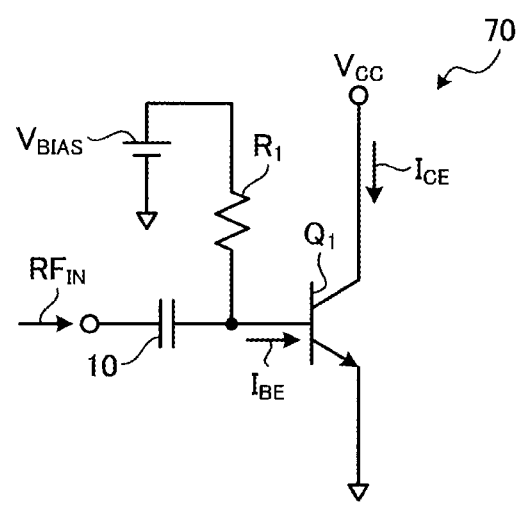
FIG. 10 illustrates an equivalent circuit of an amplifier and a bias circuit that are included in the power amplifier circuit according to the second embodiment.

FIG. 10 illustrates an equivalent circuit of the amplifier and the bias circuit that are included in the power amplifier circuit according to the second embodiment. In an equivalent circuit 70, a constant voltage source $V_{BIAS}$ is equivalent to the transistor $Q_2$. Between a base current (bias current) $I_{BE}$ of the transistor $Q_1$ and a collector current $I_{CE}$ of the transistor $Q_1$, there is a relationship of $I_{BE}=I_{CE}/\beta$. Here, $\beta$ is a current amplification factor of the transistor $Q_1$.

Figure 11:
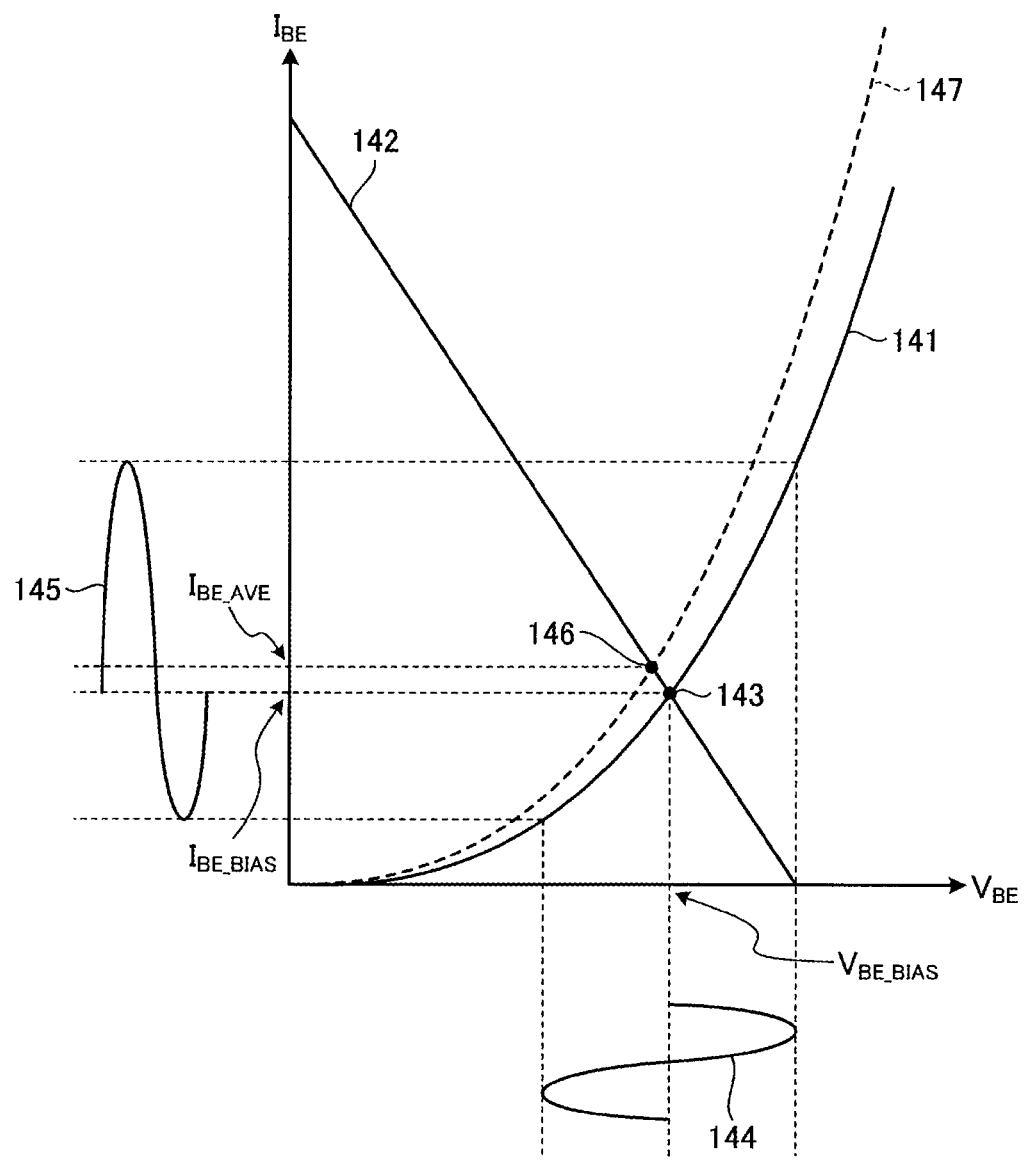
FIG. 11 illustrates characteristics of the equivalent circuit of the amplifier and the bias circuit that are included in the power amplifier circuit according to the second embodiment.

FIG. 11 illustrates characteristics of the equivalent circuit of the amplifier and the bias circuit that are included in the power amplifier circuit according to the second embodiment. More specifically, FIG. 11 illustrates a relationship between a base-emitter voltage $V_{BE}$ of the transistor $Q_1$ and a base current $I_{BE}$ of the transistor $Q_1$.

A line 141 represents $I_{BE}$-$V_{BE}$ characteristics of the transistor $Q_1$. The line 141 has a substantially exponential shape. A line 142 has a slope of $-1/R_1$ and intersects the horizontal axis at a point of $V_{BE}=V_{BIAS}$. An intersection point of the lines 141 and 142 is an operating point 143. Assume that a value of the base-emitter voltage $V_{BE}$ at the operating point 143 is an operating point bias voltage $V_{BE\_BIAS}$ and that a value of the base current $I_{BE}$ at the operating point 143 is an operating point bias current $I_{BE\_BIAS}$. A waveform 144 represents the radio frequency input signal $RF_{IN}$. A waveform 145 represents the base current $I_{BE}$.

In a positive polarity period of the waveform 144, the rate of change of the line 141 gradually increases with increasing distance from the operating point 143. Thus, in a positive polarity period of the waveform 145, the waveform 145 takes a shape in which a portion closer to a peak is elongated in a direction away from the operating point bias current $I_{BE\_BIAS}$. On the other hand, in a negative (opposite) polarity period of the waveform 144, the rate of change of the line 141 gradually decreases with increasing distance from the operating point 143. Thus, in a negative polarity period of the waveform 145, the waveform 145 takes a shape in which a portion closer to a peak is deformed in a direction toward the operating point bias current $I_{BE\_BIAS}$.

Thus, an average base current $I_{BE\_AVE}$ that is the average of base current $I_{BE}$ values in one period of the waveform 145 is higher than the operating point bias current $I_{BE\_BIAS}$. That is, in terms of the average base current $I_{BE\_AVE}$, an intersection point of the average base current $I_{BE\_AVE}$ and the line 142 is an operating point 146. Thus, in terms of the average base current $I_{BE\_AVE}$, $I_{BE}$-$V_{BE}$ characteristics of the transistor $Q_1$ are represented by a line 147 passing through the operating point 146. The average base current $I_{BE\_AVE}$ increases as the amplitude of the radio frequency input signal $RF_{IN}$ increases. In other words, the bias circuit 50 can boost the average base current $I_{BE\_AVE}$ in accordance with the amplitude of the radio frequency input signal $RF_{IN}$, that is, the power of the radio frequency input signal $RF_{IN}$.

The average base current $I_{BE\_AVE}$ depends on the power of the radio frequency input signal $RF_{IN}$, the size of the transistor $Q_1$, a resistance value of the resistor $R_1$, the size of the transistor $Q_2$, and the operating point bias current $I_{BE\_BIAS}$. For example, the bias circuit 50 can significantly boost the average base current $I_{BE\_AVE}$ by reducing the resistance value of the resistor $R_1$, or increasing the size of the transistor $Q_2$.

The load impedance $Z_{OUT}$ of the matching circuit 30B of the power amplifier circuit 214 in the second comparative example is constant regardless of the output power $P_{OUT}$. Thus, in gain characteristics of the power amplifier circuit 214 in the second comparative example, characteristics provided by the bias circuit 50 are exhibited.

Figure 12:
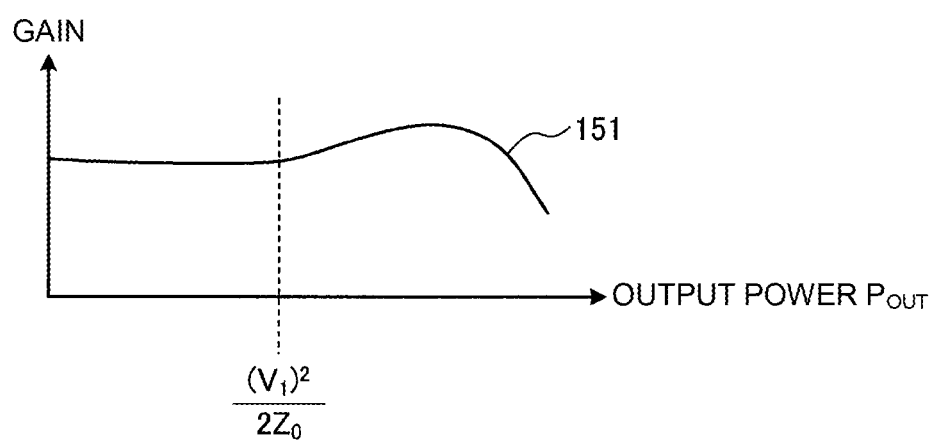
FIG. 12 illustrates characteristics of the power amplifier circuit in the second comparative example.

FIG. 12 illustrates characteristics of the power amplifier circuit in the second comparative example. More specifically, FIG. 12 illustrates a relationship between the output power $P_{OUT}$ and the gain of the power amplifier circuit 214 in the second comparative example. A line 151 represents a relationship between the output power $P_{OUT}$ and the gain of the power amplifier circuit 214 in the second comparative example.

As indicated by the line 151, the gain of the power amplifier circuit 214 in the second comparative example is mostly constant up to $P_{OUT}=(V_1)^2/Z_0$. Here, $V_1$ is output voltage amplitude ($V_{0p}$) obtained when an increase in a slope (corresponding to a current amplification factor gm of the transistor) at the operating point 146 that the radio frequency input signal $RF_{IN}$ enters in FIG. 11 appears. Subsequently, the gain of the power amplifier circuit 214 in the second comparative example starts to increase in the neighborhood of $P_{OUT}=(V_1)^2/Z_0$. The reason is as follows. The average base current $I_{BE\_AVE}$ starts to be boosted in the neighborhood of $P_{OUT}=(V_1)^2/Z_0$. When the average base current $I_{BE\_AVE}$ is boosted, the gain of the transistor $Q_1$ increases. When the output power $P_{OUT}$ reaches the neighborhood of $(V_{CC}-V_k)^2/Z_0$, the transistor $Q_1$ approaches the limit of its linear operating region, and the gain of the power amplifier circuit 214 in the second comparative example starts to decrease.

FIGS. 13A to 13D illustrate characteristics of the power amplifier circuit according to the second embodiment. More specifically, FIGS. 13A to 13D are figures in which characteristics of the power amplifier circuit according to the second embodiment are added to FIGS. 4A to 4D illustrating the characteristics of the power amplifier circuit according to the first embodiment.

Figure 13:
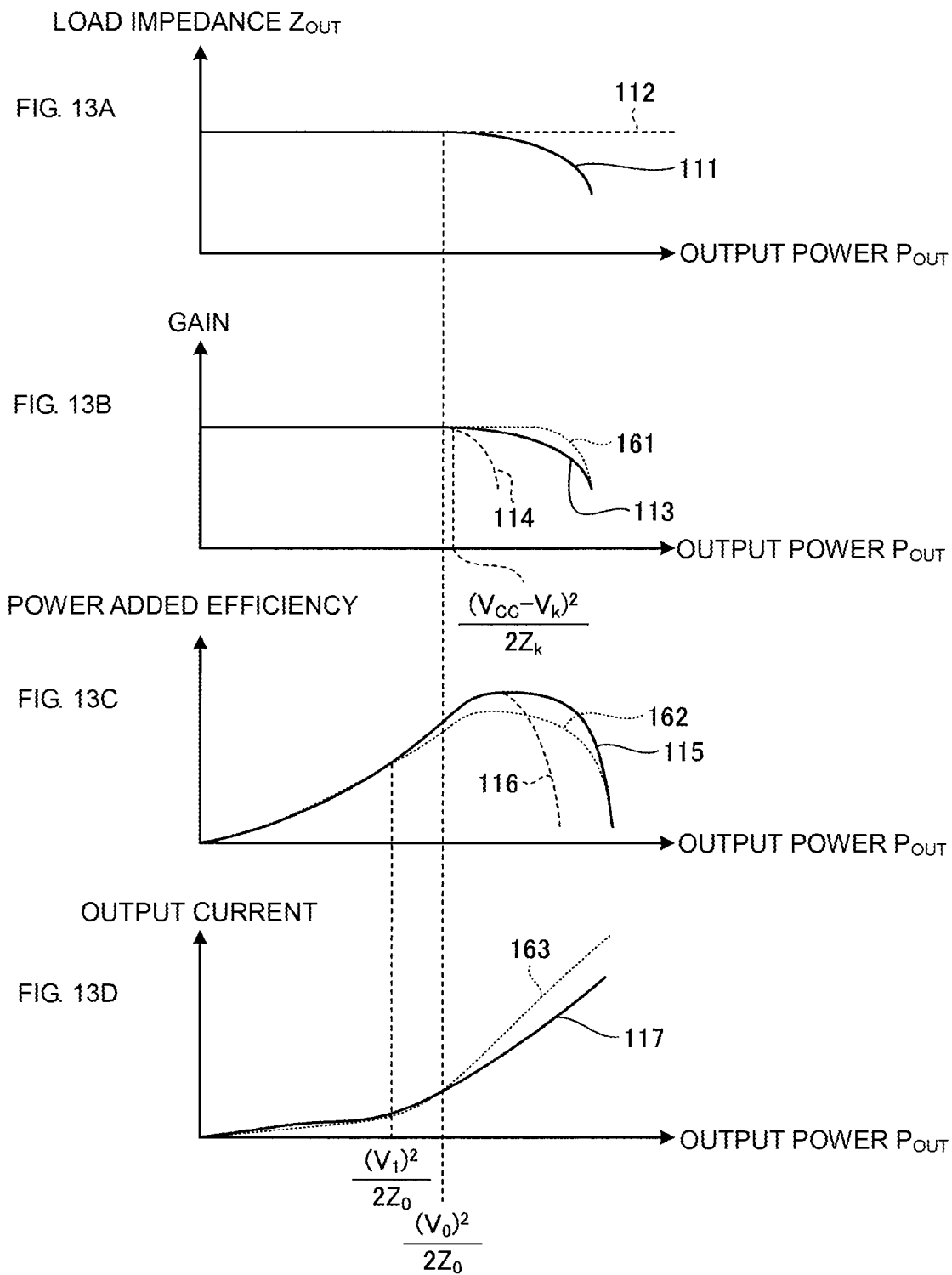
FIGS. 13A to 13D illustrate characteristics of the power amplifier circuit according to the second embodiment.

Referring to FIG. 13A, a relationship between the output power $P_{OUT}$ and the load impedance $Z_{OUT}$ of the power amplifier circuit 4A according to the second embodiment is the same as the relationship between the output power $P_{OUT}$ and the load impedance $Z_{OUT}$ of the power amplifier circuit 4 according to the first embodiment represented by the line 111.

Referring to FIG. 13B, a line 161 represents a relationship between the output power $P_{OUT}$ and the gain of the power amplifier circuit 4A according to the second embodiment. As indicated by the line 161, the gain of the power amplifier circuit 4A according to the second embodiment starts to decrease at a higher output power $P_{OUT}$ level than $P_{OUT}=(V_0)^2/Z_0$. The reason is as follows. An increase in gain due to the fact that the average base current $I_{BE\_AVE}$ starts to be boosted in the neighborhood of $P_{OUT}=(V_1)^2/Z_0$ compensates for a decrease in gain due to the fact that the load impedance $Z_{OUT}$ starts to decrease in the neighborhood of $P_{OUT}=(V_0)^2/Z_0$. Here, a balance between $V_0$ and $V_1$, that is, a balance between the amount of decrease in gain due to the load impedance and the amount of increase in gain due to the boost is important.

As indicated by the line 161, the power amplifier circuit 4A according to the second embodiment keeps the gain constant up to the higher output power $P_{OUT}$ level than $P_{OUT}=(V_0)^2/Z_0$ by achieving the balance. The gain is constant, and thus the proportionality between the radio frequency input signal $RF_{IN}$ and the radio frequency output signal $RF_{OUT}$ is achieved, thereby reducing distortion of a waveform of the radio frequency output signal $RF_{OUT}$. That is, the power amplifier circuit 4A according to the second embodiment can perform linear amplification up to a high output power $P_{OUT}$ level in comparison with the power amplifier circuit 4 according to the first embodiment.

Referring to FIG. 13C, a line 162 represents a relationship between the output power $P_{OUT}$ and the power added efficiency of the power amplifier circuit 4A according to the second embodiment. As indicated by the line 162, the power added efficiency of the power amplifier circuit 4A according to the second embodiment is below the power added efficiency of the power amplifier circuit 4 according to the first embodiment over a range in which the output power $P_{OUT}$ is higher than $P_{OUT}=(V_{CC}-V_k)^2/Z_k$. The reason is as follows. The average base current $I_{BE\_AVE}$ starts to be boosted in the neighborhood of $P_{OUT}=(V_1)^2/Z_0$, and thus direct-current power consumed by the transistor $Q^1$ increases. However, in comparison with the power added efficiency of the power amplifier circuit 204 in the first comparative example (see the line 116), the power added efficiency of the power amplifier circuit 4A according to the second embodiment (see the line 162) is improved over a range in which the output power $P_{OUT}$ is high.

Referring to FIG. 13D, a line 163 represents a relationship between the output power $P_{OUT}$ and the output current of the power amplifier circuit 4A according to the second embodiment. As indicated by the line 163, the rate of increase of the output current of the power amplifier circuit 4A according to the second embodiment increases in the neighborhood of $P_{OUT}=(V_1)^2/Z_0$ as compared to that of the power amplifier circuit 4 according to the first embodiment (the line 117).

In the matching circuit 30 of the power amplifier circuit 4A according to the second embodiment, the load impedance $Z_{OUT}$ starts to decrease in the neighborhood of $P_{OUT}=(V_0)^2/Z_0$. On the other hand, the bias circuit 50 of the power amplifier circuit 4A according to the second embodiment starts to boost the base current $I_{BE}$ in the neighborhood of $P_{OUT}=(V_1)^2/Z_0$. Thus, in the power amplifier circuit 4A according to the second embodiment, an increase in gain due to a boost in the base current $I_{BE}$ compensates for a decrease in gain due to a decrease in the load impedance $Z_{OUT}$. Hence, the power amplifier circuit 4A according to the second embodiment can perform linear amplification up to a high output power $P_{OUT}$ level in comparison with the power amplifier circuit 4 according to the first embodiment. Furthermore, in comparison with the power added efficiency of the power amplifier circuit 204 in the first comparative example, the power added efficiency of the power amplifier circuit 4A according to the second embodiment can be improved over a range in which the output power $P_{OUT}$ is high.

That is, in the power amplifier circuit 4A according to the second embodiment, the variable capacitor 32 and the bias circuit 50 complement each other.

Third Embodiment

Figure 14:
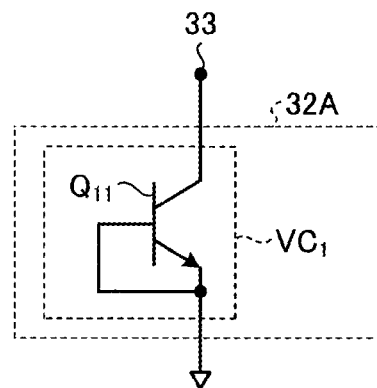
FIG. 14 illustrates a configuration of a variable capacitor of a power amplifier circuit according to a third embodiment.

FIG. 14 illustrates a configuration of a variable capacitor of a power amplifier circuit according to a third embodiment. The entire configuration of the power amplifier circuit according to the third embodiment is the same as that of the power amplifier circuit 4A according to the second embodiment, and an illustration and description thereof are omitted. Furthermore, components that are the same as those in the first or second embodiment are denoted by the same reference numerals, and description thereof is omitted.

The variable capacitance element $VC_1$ of a variable capacitor 32A includes a transistor $Q_{11}$. Although an example of the transistor $Q_{11}$ is an NPN-type HBT, the transistor $Q_{11}$ is not limited to this. For example, the transistor $Q_{11}$ may be a PNP-type HBT. A base and an emitter of the transistor $Q_{11}$ are connected to the reference potential. A collector of the transistor $Q_{11}$ is connected to the second node 33. That is, the variable capacitance element $VC_1$ is a base-collector PN junction capacitor of the transistor $Q_{11}$.

The transistor $Q_{11}$ may be an N-channel MOS transistor whose gate and source are connected to the reference potential and whose drain is connected to the second node 33. In this case, the variable capacitance element $VC_1$ is a gate-drain MOS capacitor of the N-channel MOS transistor. The transistor $Q_{11}$ may be a P-channel MOS transistor.

A withstand voltage of the base-collector PN junction capacitor of the transistor $Q_{11}$ is about 4 to 5 times higher than a withstand voltage for the case where the transistor $Q_{11}$ performs transistor operation (for example, amplification operation or switching operation). The matching circuit 30 (see FIG. 6) converts a load impedance $Z_{OUT}$ of about 4 ohms of the first node 21 as seen from the amplifier 20 side into an impedance of about 14 ohms of the second node 33 as seen from the matching circuit 40 side, for example. That is, the impedance of the second node 33 is about 3.5 times higher than the impedance of the first node 21. Thus, the amplitude of the radio frequency output signal $RF_{OUT}$ at the second node 33 is about 1.9 times higher than the amplitude of the radio frequency output signal $RF_{OUT}$ at the first node 21. Hence, the base-collector PN junction capacitor of the variable capacitor 32A has a sufficient withstand voltage.

First Modification of Third Embodiment

At the second node 33, the radio frequency output signal $RF_{OUT}$ swings in a positive polarity direction and an opposite polarity direction (negative direction) equally around the power supply potential $V_{CC}$. If the output power $P_{OUT}$ is high, the radio frequency output signal $RF_{OUT}$ swings strongly in the positive polarity direction and the opposite polarity direction. When the radio frequency output signal $RF_{OUT}$ swings strongly in the opposite polarity direction, a high bias voltage in the positive polarity direction may be applied to the base-collector PN junction capacitor. In this case, losses in the base-collector PN junction capacitor increase.

Figure 15:
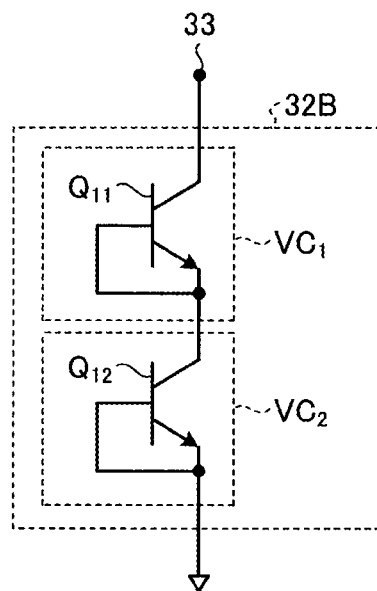
FIG. 15 illustrates a configuration of a variable capacitor of the power amplifier circuit according to a first modification of the third embodiment.

FIG. 15 illustrates a configuration of a variable capacitor of the power amplifier circuit according to a first modification of the third embodiment.

A variable capacitor 32B includes variable capacitance elements $VC_1$ and $VC_2$. The variable capacitance element $VC_1$ and the variable capacitance element $VC_2$ are connected in series between the second node 33 and the reference potential.

The variable capacitance element $VC_2$ includes a transistor $Q_{12}$. Although an example of the transistor $Q_{12}$ is an NPN-type HBT, the transistor $Q_{12}$ is not limited to this. A base and an emitter of the transistor $Q_{12}$ are connected to the reference potential. A collector of the transistor $Q_{12}$ is connected to the base and the emitter of the transistor $Q_{11}$. That is, the variable capacitance element $VC_2$ is a base-collector PN junction capacitor of the transistor $Q_{12}$.

As just described, when the variable capacitance element $VC_1$ and the variable capacitance element $VC_2$ are connected in series between the second node 33 and the reference potential, the voltage of the radio frequency output signal $RF_{OUT}$ is divided between the variable capacitance element $VC_1$ and the variable capacitance element $VC_2$. Thus, the variable capacitor 32B can keep a high bias voltage in the positive polarity direction from being applied to the base-collector PN junction capacitor, and can reduce losses in the base-collector PN junction capacitor. Hence, even if the output power $P_{OUT}$ is high, the electrostatic capacitance of the variable capacitor 32B can be desirably changed.

Although the case where two variable capacitance elements $VC_1$ and $VC_2$ are connected in series between the second node 33 and the reference potential has been described herein, the configuration of the variable capacitor 32B is not limited to this. Three or more variable capacitance elements may be connected in series between the second node 33 and the reference potential. Thus, even if the output power $P_{OUT}$ is higher, the electrostatic capacitance of the variable capacitor 32B can be desirably changed.

Second Modification of Third Embodiment

Figure 16:
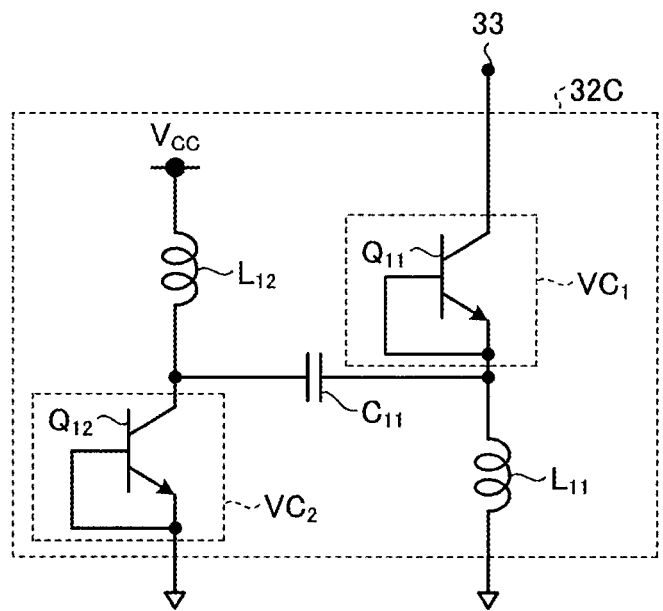
FIG. 16 illustrates a configuration of a variable capacitor of the power amplifier circuit according to a second modification of the third embodiment.

FIG. 16 illustrates a configuration of a variable capacitor of the power amplifier circuit according to a second modification of the third embodiment.

A variable capacitor 32C of the power amplifier circuit according to the second modification of the third embodiment includes the variable capacitance elements $VC_1$ and $VC_2$, direct-current choke inductors $L_{11}$ and $L_{12}$ that are inductive elements, and a capacitor $C_{11}$ that is a capacitive element.

The variable capacitance element $VC_1$ includes the transistor Q. The collector of the transistor $Q_{11}$ is connected to the second node 33. The base and the emitter of the transistor $Q_{11}$ are connected to one end of the direct-current choke inductor $L_{11}$. The other end of the direct-current choke inductor $L_{11}$ is connected to the reference potential. Thus, the base and the emitter of the transistor $Q_{11}$ are biased to the reference potential. That is, a collector-emitter junction of the transistor $Q_{11}$ is biased to ($V_{CC}$–$V_{SS}$) volts. Here, $V_{SS}$ is the reference potential. The direct-current choke inductor $L_{11}$ has an impedance high enough for a frequency band of the radio frequency output signal $RF_{OUT}$.

The variable capacitance element $VC_2$ includes the transistor $Q_{12}$. The base and the emitter of the transistor $Q_{12}$ are connected to the reference potential. The collector of the transistor $Q_{12}$ is connected to one end of the direct-current choke inductor $L_{12}$. The other end of the direct-current choke inductor $L_{12}$ is connected to the power supply potential $V_{CC}$. Thus, the collector of the transistor $Q_{12}$ is biased to the power supply potential $V_{CC}$. That is, a collector-emitter junction of the transistor $Q_{12}$ is biased to ($V_{CC}$–$V_{SS}$) volts. The direct-current choke inductor $L_{12}$ has an impedance high enough for the frequency band of the radio frequency output signal $RF_{OUT}$.

The capacitor $C_{11}$ is connected between a connection point between the one end of the direct-current choke inductor $L_{11}$ and the base and the emitter of the transistor $Q_{11}$ and a connection point between the collector of the transistor $Q_{12}$ and the one end of the direct-current choke inductor $L_{12}$. The capacitor $C_{11}$ provides coupling between the connection point between the one end of the direct-current choke inductor $L_{11}$ and the base and the emitter of the transistor $Q_{11}$ and the connection point between the collector of the transistor $Q_{12}$ and the one end of the direct-current choke inductor $L_{12}$.

In the variable capacitor 32C, the voltage of the radio frequency output signal $RF_{OUT}$ is divided between the variable capacitance element $VC_1$ and the variable capacitance element $VC_2$. Thus, even if a peak to peak voltage of the radio frequency output signal $RF_{OUT}$ is about 4 times higher than the power supply potential $V_{CC}$, the electrostatic capacitance of the variable capacitor 32C can be desirably changed.

Third Modification of Third Embodiment

Figure 17:
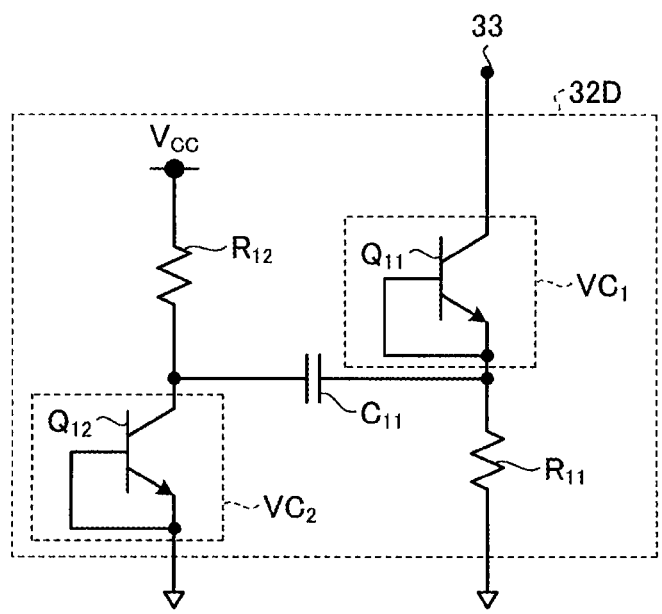
FIG. 17 illustrates a configuration of a variable capacitor of the power amplifier circuit according to a third modification of the third embodiment.

FIG. 17 illustrates a configuration of a variable capacitor of the power amplifier circuit according to a third modification of the third embodiment. In a variable capacitor 32D, the direct-current choke inductor $L_{11}$ and the direct-current choke inductor $L_{12}$ that are included in the variable capacitor 32C of the power amplifier circuit according to the second modification of the third embodiment are respectively replaced with a resistor $R_{11}$ and a resistor $R_{12}$.

The variable capacitor 32D achieves the same effect as the variable capacitor 32C of the power amplifier circuit according to the second modification of the third embodiment. Furthermore, the resistor $R_{11}$ and the resistor $R_{12}$ have a smaller footprint on a board than the direct-current choke inductor $L_{11}$ and the direct-current choke inductor $L_{12}$. Thus, the variable capacitor 32D enables a reduction in circuit size.

Fourth Embodiment

Figure 18:
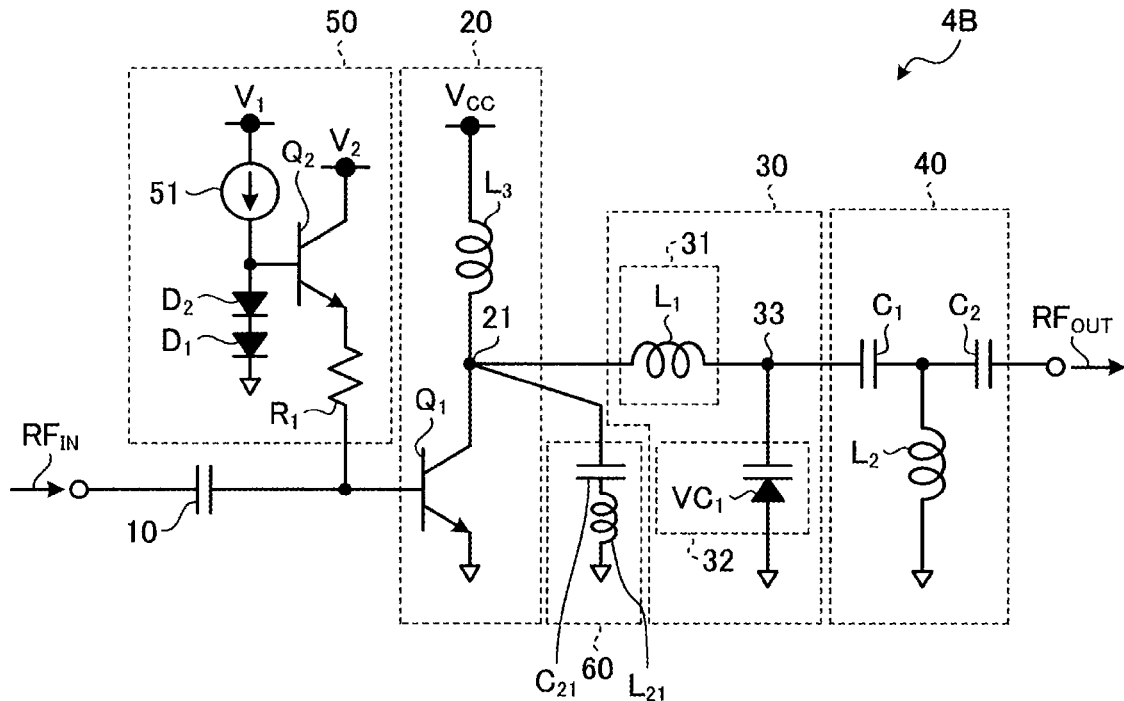
FIG. 18 illustrates a configuration of a power amplifier circuit according to a fourth embodiment.

FIG. 18 illustrates a configuration of a power amplifier circuit according to a fourth embodiment. Components that are the same as those in the first to third embodiments are denoted by the same reference numerals, and description thereof is omitted.

A power amplifier circuit 4B further includes a harmonic termination circuit 60 in addition to the components of the power amplifier circuit 4A according to the second embodiment. The harmonic termination circuit 60 includes a capacitor $C_{21}$ whose one end is connected to the first node 21, and an inductor $L_{21}$ connected between the capacitor $C_{21}$ and the reference potential. That is, the harmonic termination circuit 60 includes a series LC circuit. One end of the inductor $L_{21}$ may be connected to the first node 21, and the capacitor $C_{21}$ may be connected between the inductor $L_{21}$ and the reference potential.

A resonant frequency f of the harmonic termination circuit 60 is represented by the following Equation (3).

$$f = \frac{1}{2\pi\sqrt{L_{21}C_{21}}} \quad (3)$$

When values of the capacitor $C_{21}$ and the inductor $L_{21}$ are determined so that the resonant frequency f of the harmonic termination circuit 60 coincides with a frequency of a second harmonic of the radio frequency output signal $RF_{OUT}$, the harmonic termination circuit 60 terminates the second harmonic of the radio frequency output signal $RF_{OUT}$ to the reference potential. In this case, the power amplifier circuit 4B performs class-F operation.

When values of the capacitor $C_{21}$ and the inductor $L_{21}$ are determined so that the resonant frequency f of the harmonic termination circuit 60 coincides with a frequency of a third harmonic of the radio frequency output signal $RF_{OUT}$, the harmonic termination circuit 60 terminates the third harmonic of the radio frequency output signal $RF_{OUT}$ to the reference potential. In this case, the power amplifier circuit 4B performs inverse class-F operation.

Thus, the power amplifier circuit 4B reduces losses in the transistor $Q_1$ by suppressing harmonics to enable a further improvement in efficiency.

As described above, in FIG. 11, the waveform 145 of the base current $I_{BE}$ has distortion. However, when the power amplifier circuit 4B terminates a harmonic with the harmonic termination circuit 60, the distortion of the waveform 145 of the base current $I_{BE}$ can be improved.

Fifth Embodiment

In the power amplifier circuits 4 to 4B according to the first to fourth embodiments, the inductor $L_1$ and the variable capacitance element $VC_1$ that are included in the matching circuit 30 constitute the same configuration as an LC low pass filter. Furthermore, the capacitor $C_1$ and the inductor $L_2$ that are included in the matching circuit 40 constitute the same configuration as a CL high pass filter. That is, the matching circuits 30 and 40 constitute the same configuration as an LC-CL low pass-high pass filter. However, the configuration of the matching circuits 30 and 40 is not limited to this.

Figure 19:
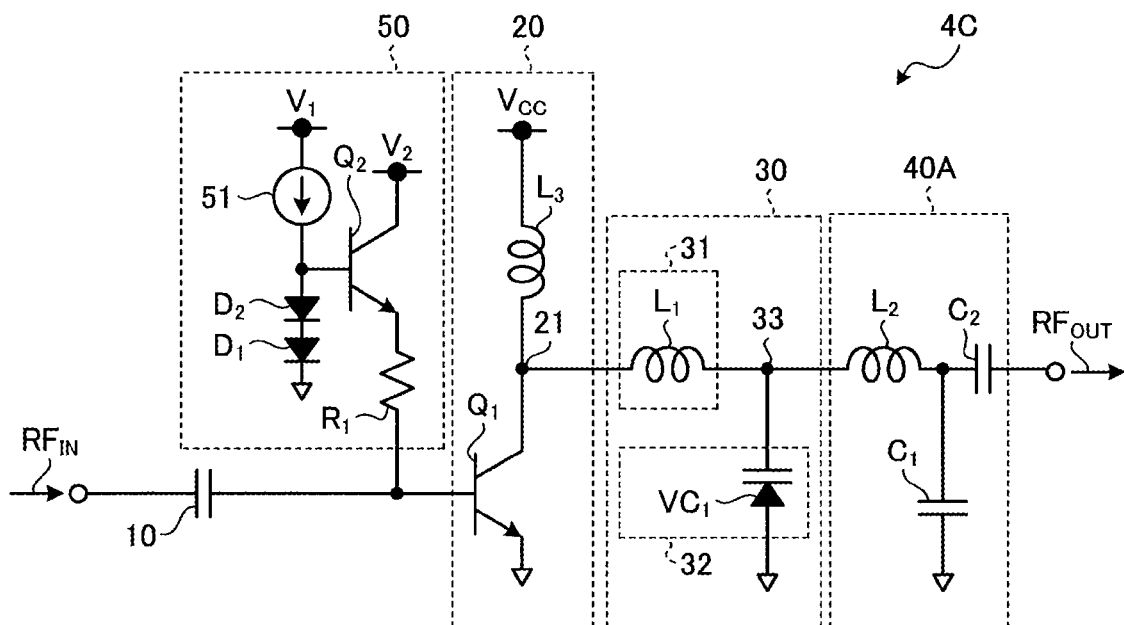
FIG. 19 illustrates a configuration of a power amplifier circuit according to a fifth embodiment.

FIG. 19 illustrates a configuration of a power amplifier circuit according to a fifth embodiment. Components that are the same as those in the first to fourth embodiments are denoted by the same reference numerals, and description thereof is omitted.

In a power amplifier circuit 4C, the matching circuit 40 of the power amplifier circuit 4A according to the second embodiment is replaced with a matching circuit 40A.

The matching circuit 40A includes the capacitors $C_1$ and $C_2$, and the inductor $L_2$. One end of the inductor $L_2$ is connected to the second node 33. The capacitor $C_1$ is connected between the other end of the inductor $L_2$ and the reference potential. The one end of the capacitor $C_2$ is connected to a connection point between the inductor $L_2$ and the capacitor $C_1$. The capacitor $C_2$ serves not only as an impedance matching element but also as a coupling capacitor. The radio frequency output signal $RF_{OUT}$ is output from the other end of the capacitor $C_2$ to the subsequent front-end unit 5 (see FIG. 1).

The inductor $L_2$ and the capacitor $C_1$ that are included in the matching circuit 40A constitute the same configuration as an LC low pass filter. That is, the matching circuits 30 and 40A constitute the same configuration as an LC-LC low pass-low pass filter.

The power amplifier circuit 4C can easily attenuate harmonics of the radio frequency output signal $RF_{OUT}$ and thus achieve power amplification with a large amount of harmonic suppression.

Sixth Embodiment

Figure 20:
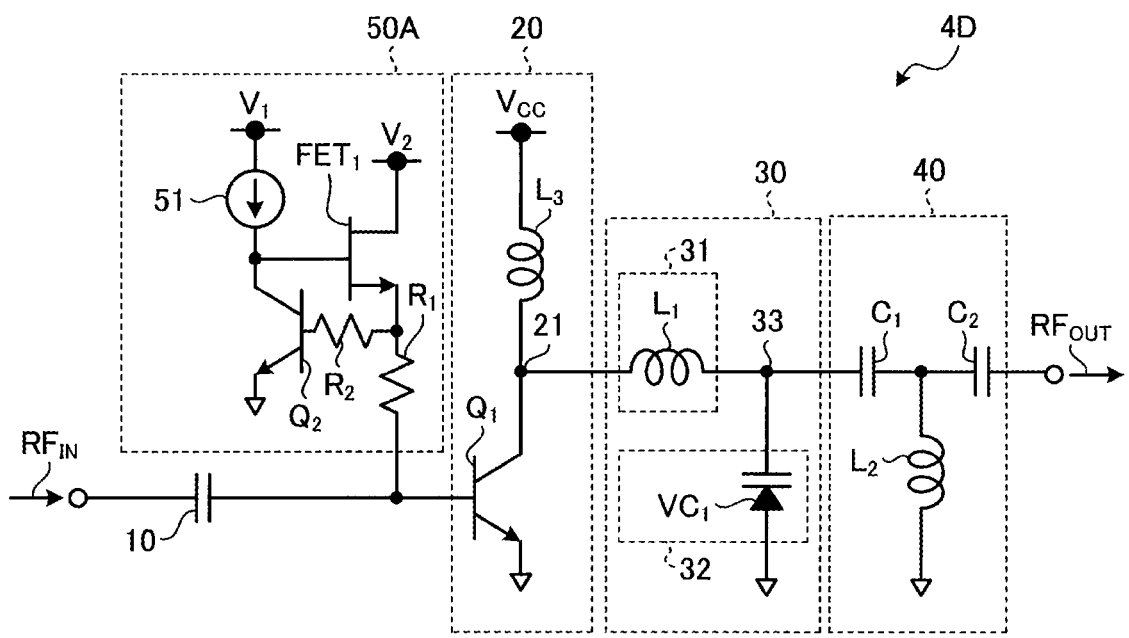
FIG. 20 illustrates a configuration of a power amplifier circuit according to a sixth embodiment.

FIG. 20 illustrates a configuration of a power amplifier circuit according to a sixth embodiment. Components that are the same as those in the first to fifth embodiments are denoted by the same reference numerals, and description thereof is omitted.

In a power amplifier circuit 4D, the bias circuit 50 of the power amplifier circuit 4A according to the second embodiment is replaced with a bias circuit 50A.

The bias circuit 50A includes the constant current source 51, transistors $FET_1$ and $Q_2$, and resistors $R_1$ and $R_2$ that are resistive elements. Although an example of the transistor $FET_1$ is a field-effect transistor (FET) fabricated by a bipolar field-effect transistor (BiFET) process, the transistor $FET_1$ is not limited to this. Although an example of the transistor $Q_2$ is an NPN-type HBT, the transistor $Q_2$ is not limited to this. It is desirable that the transistor $Q_2$ is of the same type and has the same size and characteristics as the transistor $Q_1$. It is desirable that the resistor $R_1$ and the resistor $R_2$ have the same resistance value.

One end of the resistor $R_1$ is connected to the base of the transistor $Q_1$. The other end of the resistor $R_1$ is connected to a source of the transistor $FET_1$. A drain of the transistor $FET_1$ is connected to the power supply potential $V_2$. A gate of the transistor $FET_1$ is connected to the constant current source 51. The transistor $FET_1$ and the resistor $R_1$ constitute a source follower circuit.

The emitter of the transistor $Q_2$ is connected to the reference potential. The collector of the transistor $Q_2$ is connected to a connection point between the constant current source 51 and the gate of the transistor $FET_1$. One end of the resistor $R_2$ is connected to the base of the transistor $Q_2$. The other end of the resistor $R_2$ is connected to a connection point between the transistor $FET_1$ and the resistor $R_1$.

The source follower circuit constituted by the transistor $FET_1$ and the resistor $R_1$ achieves the same effect as the emitter follower circuit constituted by the transistor $Q_2$ and the resistor $R_1$ that are included in the bias circuit 50. That is, the source follower circuit constituted by the transistor $FET_1$ and the resistor $R_1$ can boost the base current (bias current) of the transistor $Q_1$, as indicated by the line 151 in FIG. 12.

Incidentally, it is desirable that an operating point of the transistor $Q_1$ is determined not by the power supply potential $V_1$ but by the constant current of the constant current source 51. However, a bipolar transistor is a current control element, whereas a field-effect transistor is a voltage control element. Thus, when the bias circuit 50A includes the transistor Q2 and the resistor R2, the operating point of the transistor $Q_1$ is determined by the constant current of the constant current source 51.

Both when the transistors $Q_1$ and $Q_2$ are of the same type and have the same size and characteristics and when the resistors $R_1$ and $R_2$ have the same resistance value, the transistors $Q_1$, $Q_2$, and $FET_1$, and the resistors $R_1$ and $R_2$ constitute the same circuit configuration as a base current compensation current mirror circuit.

A drain-source current of the transistor $FET_1$ is divided into two equal currents at a connection point between the resistor $R_1$ and resistor $R_2$. One of the two equal currents flows into the base of the transistor $Q_1$ through the resistor $R_1$ to serve as a base current. The other flows into the base of the transistor $Q_2$ through the resistor $R_2$ to serve as a base current. Thus, a collector-emitter current of the transistor $Q_1$ is the same as a collector-emitter current of the transistor $Q_2$. That is, the collector-emitter current of the transistor $Q_1$ is the same as the constant current of the constant current source 51. Thus, the operating point of the transistor $Q_1$ can be determined by the constant current of the constant current source 51.

Furthermore, when the resistor $R_1$ and the resistor $R_2$ have respective different resistance values, or when the transistor $Q_1$ and transistor $Q_2$ have respective different sizes, the base current of the transistor $Q_1$ can be adjusted, and the collector-emitter current of the transistor $Q_1$ can be adjusted.

The power amplifier circuit 4D is compared with the power amplifier circuit 4A according to the second embodiment.

In the power amplifier circuit 4A, the power supply potential $V_1$ has to be greater than the sum of the base-emitter voltage of the transistor $Q_1$ and the base-emitter voltage of the transistor $Q_2$. For example, assume that the base-emitter voltage of the transistor $Q_1$ and the base-emitter voltage of the transistor $Q_2$ are each about 1.3 V. In this case, in the power amplifier circuit 4A, the power supply potential $V_1$ has to be about 3.0 V obtained by adding a margin to the sum of 1.3 V and 1.3 V.

On the other hand, in the power amplifier circuit 4D, for example, assume that the base-emitter voltage of the transistor $Q_1$ is about 1.3 V. Furthermore, the transistor $FET_1$ can operate when a gate-source voltage is about 0.3 V or more. In this case, in the power amplifier circuit 4D, the power supply potential $V_1$ of about 2.5 V obtained by adding a margin to the sum of 1.3 V and 0.3 V is sufficient.

Thus, the power amplifier circuit 4D can operate even at a low power supply voltage in comparison with the power amplifier circuit 4A. In particular, in the case where the power amplifier circuit 4D is used in portable electronic devices, such as cellular phone devices and smartphones, the power amplifier circuit 4D can operate even at a low battery voltage.

The above-described embodiments are provided for facilitating understanding of the present disclosure but not provided for limiting the present disclosure. The present disclosure can be modified or improved without departing from the gist of thereof, and the present disclosure includes equivalents thereof.

While embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A power amplifier circuit comprising:
    an amplifier configured to receive an input signal having an alternating current and to output an amplified signal from an output of the amplifier to a first node, the amplified signal being obtained by amplifying a power of the input signal;
    an inductive element that is directly connected between the first node and a second node and to the output of the amplifier; and
    a variable capacitor that is directly connected between the second node and a reference potential,
wherein an electrostatic capacitance of the variable capacitor increases as a power of the amplified signal increases.

2. The power amplifier circuit according to claim 1, wherein the variable capacitor comprises a junction capacitance element.

3. The power amplifier circuit according to claim 2,
    wherein the junction capacitance element is a bipolar transistor, and
    wherein a base of the bipolar transistor is connected to an emitter of the bipolar transistor.

4. The power amplifier circuit according to claim 2,
    wherein the junction capacitance element is a field-effect transistor, and
    wherein a gate of the field-effect transistor is connected to a source of the field-effect transistor.

5. The power amplifier circuit according to claim 2, wherein the junction capacitance element is a variable capacitance diode.

6. The power amplifier circuit according to claim 1, wherein the variable capacitor comprises a plurality of junction capacitance elements that are connected in series between the second node and the reference potential.

7. The power amplifier circuit according to claim 6, comprising two junction capacitance elements connected in series, wherein each of the junction capacitance elements is a bipolar transistor having a base and emitter connected to each other.

8. The power amplifier circuit according to claim 1, wherein the variable capacitor comprises:
   a first junction capacitance element having a first end connected to the second node,
   a first inductive element that is connected between a second end of the first junction capacitance element and the reference potential,
   a second inductive element having a first end connected to a power supply potential,
   a second junction capacitance element that is connected between a second end of the second inductive element and the reference potential, and
   a capacitive element that is connected between the second end of the second inductive element and the second end of the first junction capacitance element.

9. The power amplifier circuit according to claim 1, wherein the variable capacitor comprises:
   a first junction capacitance element having a first end connected to the second node,
   a first resistive element that is connected between a second end of the first junction capacitance element and the reference potential,
   a second resistive element having a first end connected to a power supply potential,
   a second junction capacitance element that is connected between a second end of the second resistive element and the reference potential, and
   a capacitive element that is connected between the second end of the second resistive element and the second end of the first junction capacitance element.

10. The power amplifier circuit according to claim 1, further comprising:
    a harmonic termination circuit that is connected between the first node and the reference potential and that is configured to terminate a harmonic of the amplified signal.

11. The power amplifier circuit according to claim 1, further comprising:
    a bias circuit configured to output, to the amplifier, a bias current that increases as the power of the input signal increases.

12. The power amplifier circuit according to claim 11, wherein the bias circuit comprises an emitter follower circuit that comprises:
    a resistive element having a first end connected to an input terminal of the amplifier, and a bipolar transistor having an emitter connected to a second end of the resistive element.

13. The power amplifier circuit according to claim 11, wherein the bias circuit comprises a source follower circuit that comprises:
    a resistive element having a first end connected to an input terminal of the amplifier, and a field-effect transistor having a source connected to a second end of the resistive element.

14. The power amplifier circuit according to claim 1, further comprising:
    a matching circuit connected to the second node.

15. The power amplifier circuit according to claim 2, further comprising:
    a harmonic termination circuit that is connected between the first node and the reference potential and that is configured to terminate a harmonic of the amplified signal.

16. The power amplifier circuit according to claim 3, further comprising:
    a harmonic termination circuit that is connected between the first node and the reference potential and that is configured to terminate a harmonic of the amplified signal.

17. The power amplifier circuit according to claim 4, further comprising:
    a harmonic termination circuit that is connected between the first node and the reference potential and that is configured to terminate a harmonic of the amplified signal.

18. The power amplifier circuit according to claim 2, further comprising:
    a bias circuit configured to output, to the amplifier, a bias current that increases as the power of the input signal increases.

19. The power amplifier circuit according to claim 3, further comprising:
    a bias circuit configured to output, to the amplifier, a bias current that increases as the power of the input signal increases.

20. The power amplifier circuit according to claim 4, further comprising:
    a bias circuit configured to output, to the amplifier, a bias current that increases as the power of the input signal increases.

* * * * *

UNITED STATES PATENT AND TRADEMARK OFFICE
CERTIFICATE OF CORRECTION

PATENT NO. : 10,715,084 B2
APPLICATION NO. : 16/136359
DATED : July 14, 2020
INVENTOR(S) : Satoshi Tanaka Page 1 of 1

It is certified that error appears in the above-identified patent and that said Letters Patent is hereby corrected as shown below:

In the Specification

Column 14, Line 29, "Q. The collector" should read -- $Q_{11}$. The collector --

Signed and Sealed this
First Day of December, 2020

Andrei Iancu
*Director of the United States Patent and Trademark Office*